United States Patent
Moser et al.

(10) Patent No.: US 10,923,432 B2
(45) Date of Patent: Feb. 16, 2021

(54) METHOD OF MANUFACTURING A SEMICONDUCTOR DEVICE WITH EPITAXIAL LAYERS AND AN ALIGNMENT MARK

(71) Applicant: Infineon Technologies Austria AG, Villach (AT)

(72) Inventors: Andreas Moser, Maria-Rain (AT); Hans Weber, Bayerisch Gmain (DE); Johannes Baumgartl, Riegersdorf (AT); Gabor Mezoesi, Villach (AT); Michael Treu, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/794,363

(22) Filed: Feb. 19, 2020

(65) Prior Publication Data

US 2020/0185335 A1 Jun. 11, 2020

Related U.S. Application Data

(60) Continuation of application No. 16/274,726, filed on Feb. 13, 2019, now Pat. No. 10,600,740, which is a division of application No. 15/379,533, filed on Dec. 15, 2016, now Pat. No. 10,236,258.

(30) Foreign Application Priority Data

Dec. 23, 2015 (DE) .......................... 10 2015 122 828

(51) Int. Cl.
*H01L 29/06* (2006.01)
*H01L 23/544* (2006.01)
(Continued)

(52) U.S. Cl.
CPC .......... *H01L 23/544* (2013.01); *G03F 9/7076* (2013.01); *H01L 21/266* (2013.01);
(Continued)

(58) Field of Classification Search
CPC . H01L 23/544; H01L 21/266; H01L 29/0634; H01L 21/308; H01L 2223/5446;
(Continued)

(56) References Cited

U.S. PATENT DOCUMENTS 6,303,460 B1 10/2001 Iwamatsu
9,625,811 B2 4/2017 Wuister et al.
(Continued)

FOREIGN PATENT DOCUMENTS

DE 19750378 A1 10/1998

*Primary Examiner* — Mohammad M Hoque
(74) *Attorney, Agent, or Firm* — Murphy, Bilak & Homiller, PLLC

(57) ABSTRACT

A semiconductor wafer includes an alignment mark contained within in a kerf region of the semiconductor wafer. The alignment mark includes a groove vertically extending from a main surface of the semiconductor wafer to a bottom surface of the groove, and at least one fin protruding from the bottom surface of the groove. The groove has a rectangular shape with four sidewalls and four inside corners, with each of the four inside corners facing the at least one fin. A minimum distance between the at least one fin and a nearest one of the four inside corners is at least 25 μm.

18 Claims, 12 Drawing Sheets

(51) Int. Cl.
*G03F 9/00* (2006.01)
*H01L 21/266* (2006.01)
*H01L 21/308* (2006.01)

(52) U.S. Cl.
CPC ........ *H01L 21/308* (2013.01); *H01L 29/0634* (2013.01); *H01L 2223/5442* (2013.01); *H01L 2223/5446* (2013.01); *H01L 2223/54426* (2013.01)

(58) Field of Classification Search
CPC ... H01L 2223/5442; H01L 2223/54426; G03F 7/70633
USPC ....................................................... 257/622
See application file for complete search history.

(56) References Cited

U.S. PATENT DOCUMENTS

| | | | |
|---|---|---|---|
| 2003/0174879 A1* | 9/2003 | Chen | ................... G03F 7/70633 382/151 |
| 2006/0284175 A1 | 12/2006 | Hiramatsu et al. | |
| 2007/0072397 A1 | 3/2007 | Yamauchi et al. | |
| 2009/0273102 A1 | 11/2009 | Nogami et al. | |
| 2012/0032356 A1 | 2/2012 | Reymann et al. | |
| 2013/0214337 A1 | 8/2013 | Kashihara | |
| 2014/0106520 A1 | 4/2014 | Yamaguchi | |
| 2014/0159126 A1 | 6/2014 | Wei et al. | |
| 2015/0000149 A1 | 1/2015 | Ortner et al. | |
| 2015/0069528 A1 | 3/2015 | Chiang et al. | |
| 2015/0091090 A1 | 4/2015 | Okuno et al. | |
| 2015/0187703 A1 | 7/2015 | Zhou | |
| 2015/0341726 A1 | 11/2015 | Friza | |
| 2015/0357406 A1* | 12/2015 | Guan | ................... H01L 21/2253 257/493 |
| 2016/0141252 A1 | 5/2016 | Wei et al. | |
| 2016/0268312 A1 | 9/2016 | Wang et al. | |
| 2016/0307803 A1 | 10/2016 | Mun et al. | |
| 2017/0170288 A1 | 6/2017 | Kiyosawa et al. | |
| 2017/0179037 A1 | 6/2017 | Lee et al. | |
| 2017/0221833 A1 | 8/2017 | Lu et al. | |

* cited by examiner

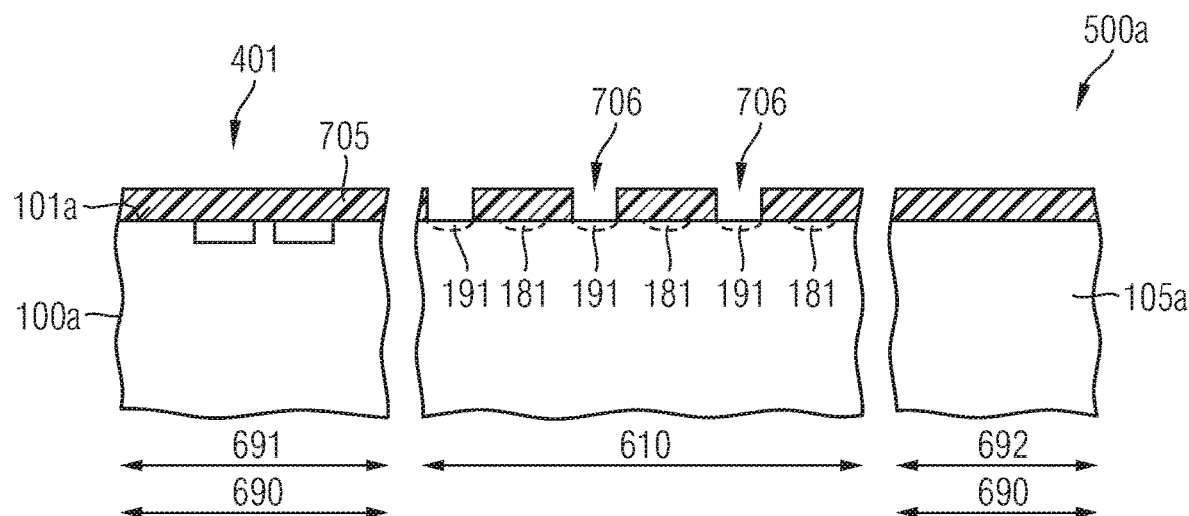
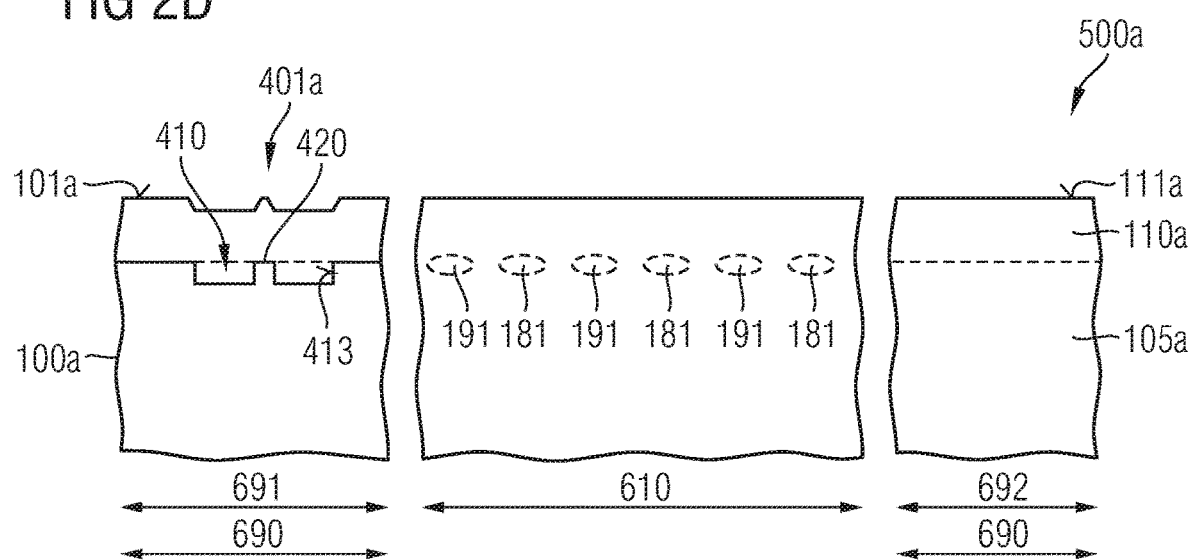

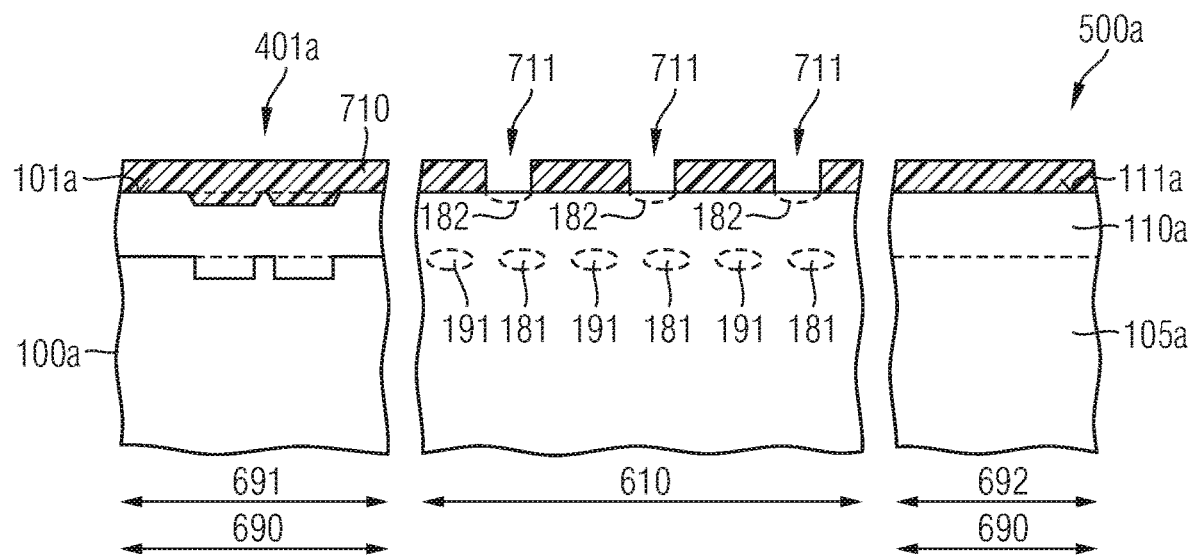
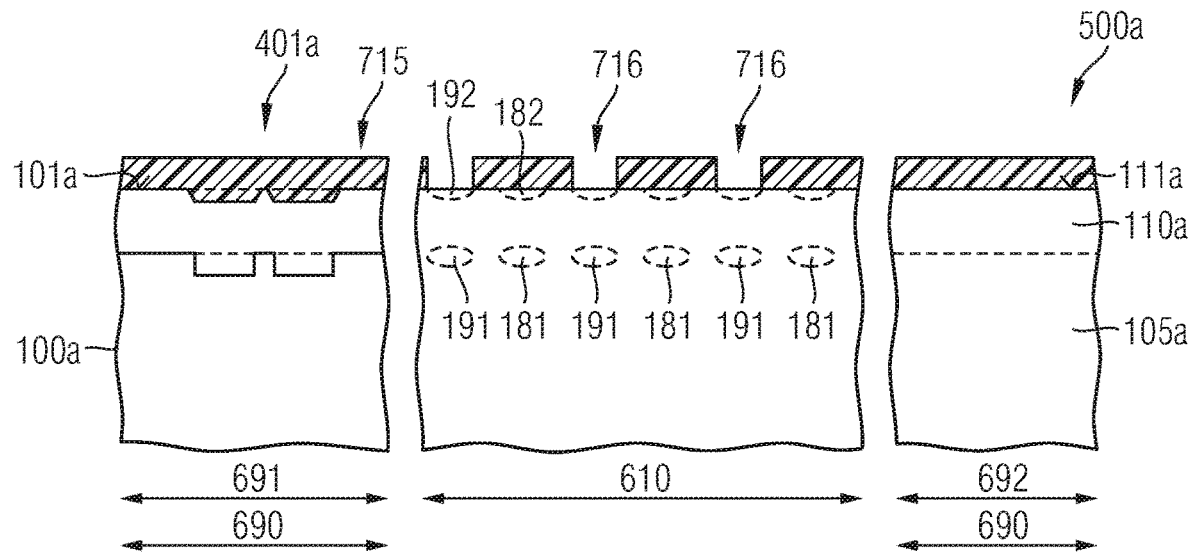

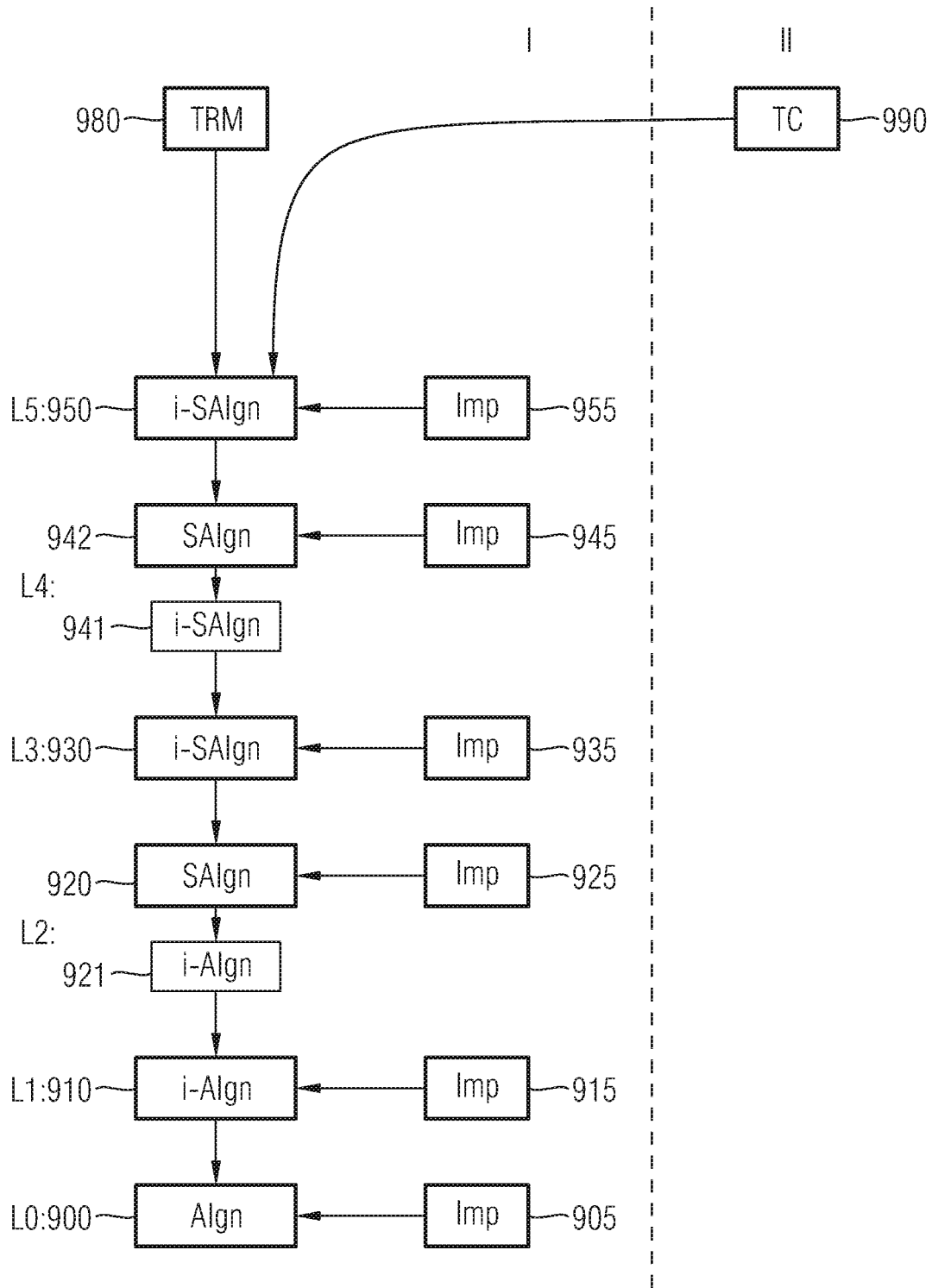

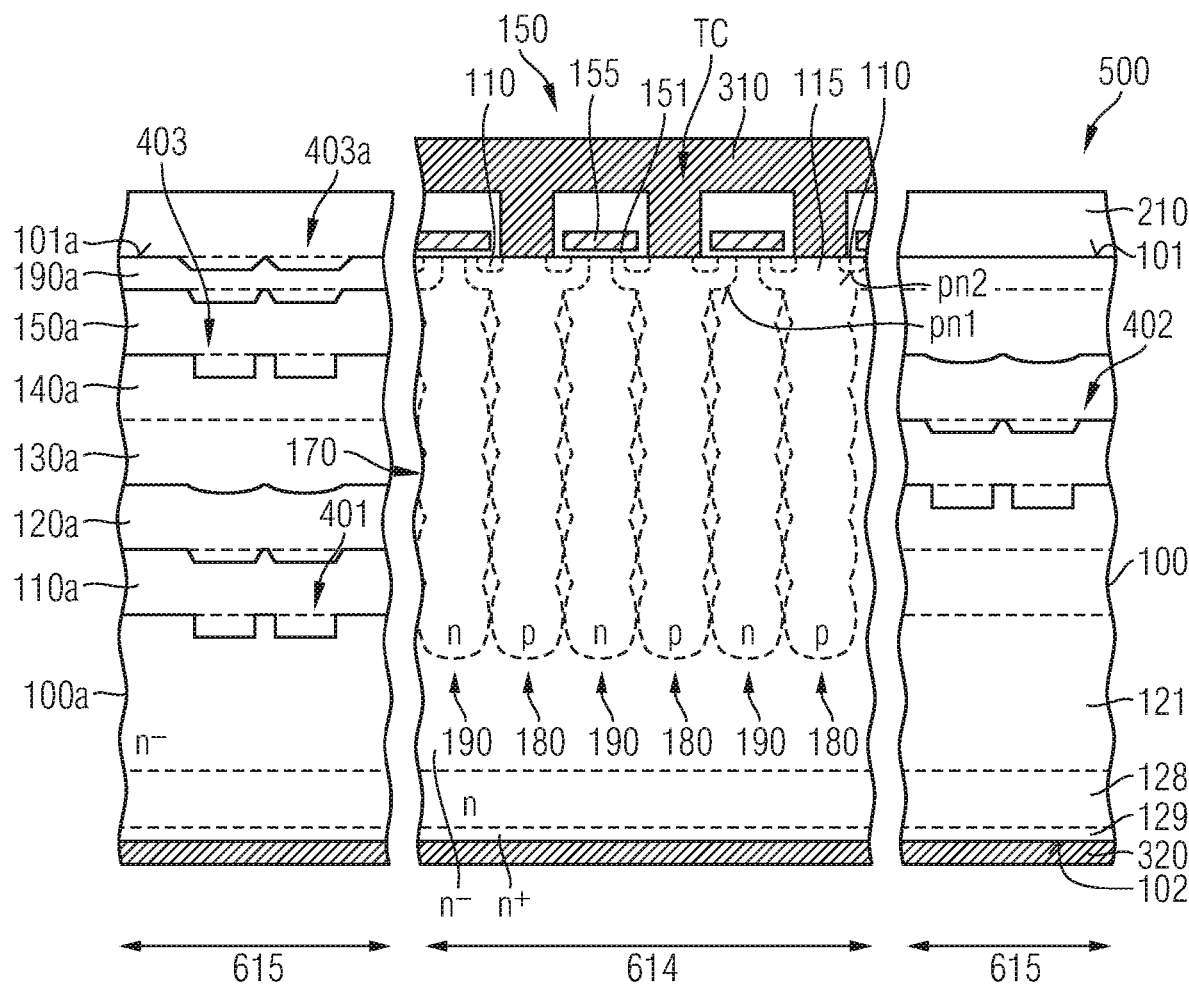

METHOD OF MANUFACTURING A SEMICONDUCTOR DEVICE WITH EPITAXIAL LAYERS AND AN ALIGNMENT MARK

RELATED APPLICATIONS

This application is a continuation of U.S. application Ser. No. 16/274,726 filed on 13 Feb. 2019, which is a divisional application of U.S. application Ser. No. 15/379,533 filed on 15 Dec. 2016, which in turn claims priority to German Patent Application No. 10 2015 122 828.9 filed on 23 Dec. 2015. The content of each of these applications is incorporated herein by reference in its entirety.

BACKGROUND

Manufacturing of semiconductor devices may include multi-step epitaxy, wherein device formation processes may be performed between successive epitaxy processes. Conventionally, device regions formed in the different epitaxial layers are adjusted to each other by aligning exposure masks to an alignment mark formed prior to the epitaxy processes in a base substrate onto which the epitaxial layers are successively grown. Typical alignment marks are based on grooves etched into the base substrate and imaged into an exposed surface of the respective epitaxial layer. Typically, high epitaxial growth rates reduce the overall process time and increase manufacturing efficiency. High epitaxial growth rates, however, tend to deform the alignment marks imaged from the base substrate into the exposed surfaces of the epitaxial layers such that at high growth rates the epitaxy distorts the alignment marks and an optical alignment device cannot reliably detect the alignment marks imaged into the exposed surfaces of the epitaxial layers. As a consequence, device regions formed in different epitaxial layers can be misaligned with respect to each other. An etching process may recover the original shape of alignment marks after epitaxy to some degree.

It is desirable to align device patterns in successively grown epitaxial layers at less effort.

SUMMARY

According to an embodiment a method of manufacturing a semiconductor device includes forming an initial alignment mark that includes a groove with a minimum width of at least 100 µm and a vertical extension in a range from 100 nm to 1 µm in a process surface of a semiconductor layer. Within the groove at least one fin formed at a distance of at least 60 µm to a closest inside corner of the groove. A device region is formed by using a mask aligned to the initial alignment mark. A thickness of the semiconductor layer is increased by growing an epitaxial layer, wherein the initial alignment mark is imaged into the process surface of the semiconductor layer with increased vertical extension. Forming of device regions and increasing a thickness of the semiconductor layer by epitaxy is repeated at least once. A substitutional alignment mark is formed that includes a groove with a minimum width of at least 100 µm and a vertical extension in a range from 100 nm to 1 µm in the process surface. Within the groove at least one fin is formed at a distance of at least 60 µm to a closest inside corner of the groove. Forming of device regions and increasing a thickness of the semiconductor layer by epitaxy are repeated at least once, wherein the respective mask is aligned to the substitutional alignment mark.

According to another embodiment, a semiconductor substrate includes an alignment mark. The alignment mark includes a groove in a process surface of a semiconductor layer. A minimum width of the groove is at least 100 µm and a vertical extension is in a range from 100 nm to 1 µm. The alignment mark further includes at least one fin within the groove and at a distance of at least 60 µm to a closest inside corner of the groove.

According to a further embodiment, a semiconductor device includes an alignment mark, which includes a groove in a process surface of a semiconductor layer. A minimum width of the groove is at least 100 µm and a vertical extension is in a range from 100 nm to 1 µm. The alignment mark further includes at least one fin within the groove and at a distance of at least 60 µm to a closest inside corner of the groove.

According to another embodiment, a semiconductor wafer includes an alignment mark contained within in a kerf region of the semiconductor wafer. The alignment mark includes a groove vertically extending from a main surface of the semiconductor wafer to a bottom surface of the groove, and at least one fin protruding from the bottom surface of the groove. The groove has a rectangular shape with four sidewalls and four inside corners, with each of the four inside corners facing the at least one fin. A minimum distance between the at least one fin and a nearest one of the four inside corners is at least 25 µm.

According to another embodiment, a semiconductor device includes an active region of a semiconductor substrate that includes one or more active semiconductor devices, an inactive region of the semiconductor substrate that is adjacent the active region and is devoid of active semiconductor devices, and an alignment mark contained within the inactive region. The alignment mark includes a groove vertically extending from a main surface of the semiconductor substrate to a bottom surface of the groove, and at least one fin protruding from the bottom surface of the groove. The groove has a rectangular shape with four sidewalls and four inside corners, with each of the four inside corners facing the at least one fin. A minimum distance between the at least one fin and a nearest one of the four inside corners is at least 25 µm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. The drawings are not necessarily to scale. Different spatial axes may have different scales.

FIG. 2C shows the semiconductor substrate portions of FIG. 2B after a second device formation process directly aligned to the initial alignment mark.

FIG. 2D is a schematic vertical cross-sectional view of the semiconductor substrate portions of FIG. 2C, after forming a first epitaxial layer.

FIG. 2E is a schematic vertical cross-sectional view of the semiconductor substrate portions of FIG. 2D, after a third device formation process aligned to a projection of the initial alignment mark in an exposed surface of the first epitaxial layer.

FIG. 2F is a schematic vertical cross-sectional view of the semiconductor substrate portions of FIG. 2E, after a fourth device formation process aligned to the projection of the initial alignment mark in the exposed surface of the first epitaxial layer.

FIG. 5 is a diagram schematically illustrating alignment relationships among device formation processes according to an embodiment referring to the manufacture of super-junction semiconductor devices.

FIG. 7 is a schematic vertical cross-sectional view of portions of a semiconductor device including a superjunction structure and a substitutional alignment mark imaged into a first surface.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having," "containing," "including," "comprising" and the like are open ended, and the terms indicate the presence of stated structures, elements or features but do not preclude additional elements or features. The articles "a," "an" and "the" are intended to include the plural as well as the singular, unless the context clearly indicates otherwise.

The Figures illustrate relative doping concentrations by indicating "−" or "+" next to the doping type "n" or "p." For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
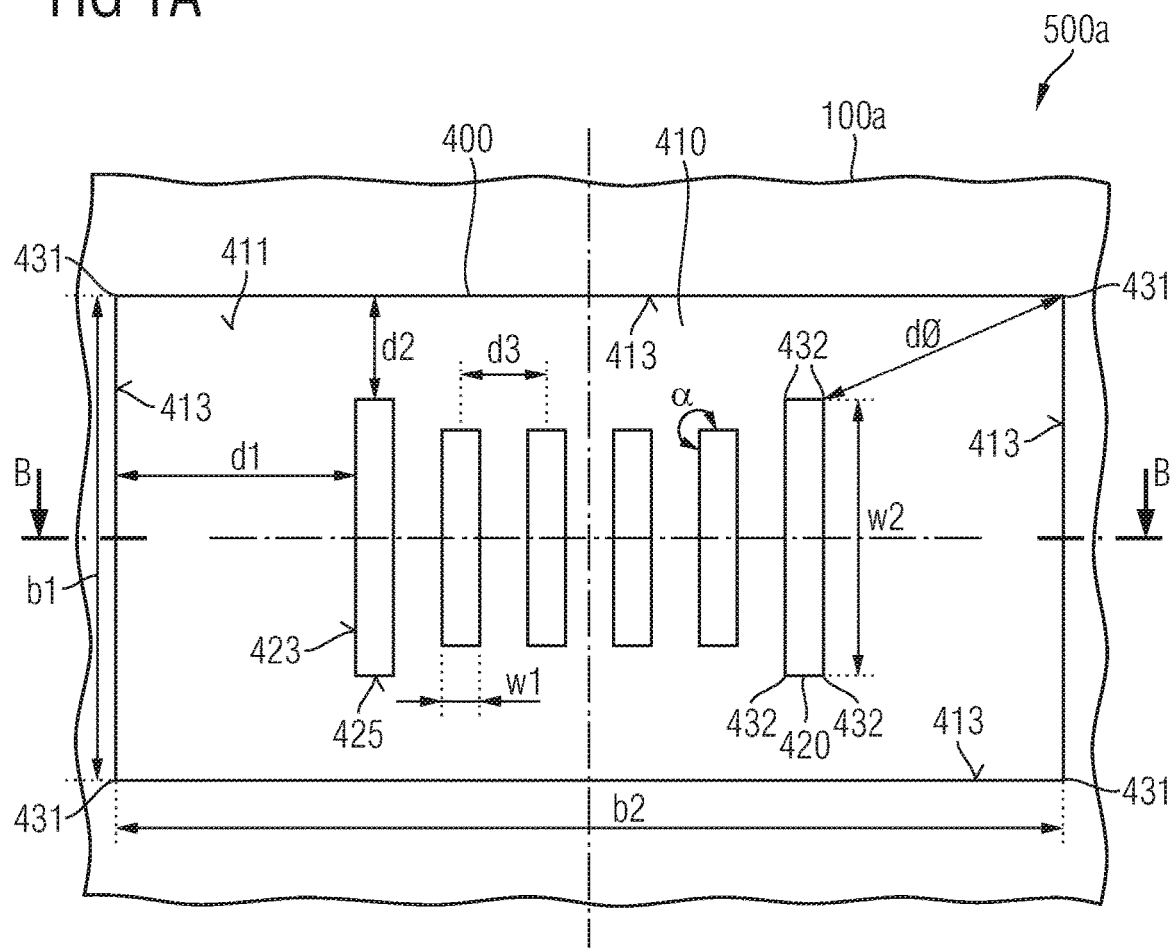
FIG. 1A is a schematic plan view of a portion of a semiconductor substrate including an alignment mark based on a wide groove formed in a process surface according to an embodiment.
Figure 1B:
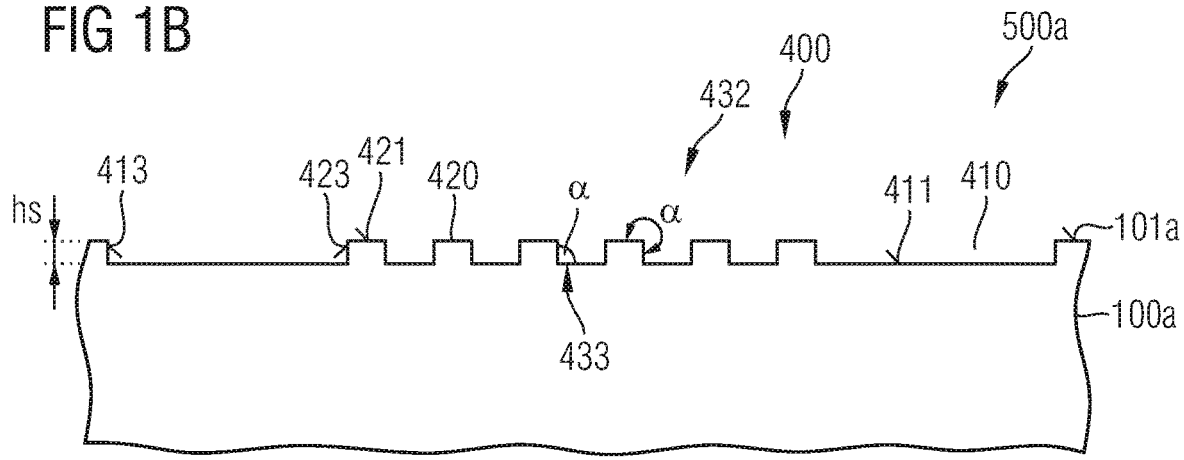
FIG. 1B is a schematic vertical cross-sectional view of the semiconductor substrate portion of FIG. 1A along line B-B.

FIGS. 1A and 1B show a semiconductor substrate 500a with an alignment mark 400 formed in a process surface 101a of a semiconductor layer 100a of a crystalline semiconductor material. The semiconductor substrate 500a may be a semiconductor wafer from which a plurality of identical semiconductor dies is obtained. Apart from the semiconductor layer 100a, the semiconductor substrate 500a may include further portions, for example an insulator portion or a heavily doped base substrate directly adjoining to the semiconductor layer 100a on the back.

The semiconductor material of the semiconductor layer 100a may be silicon (Si), silicon carbide (SiC), germanium (Ge), a silicon germanium crystal (SiGe) or an $A_{III}B_V$ semiconductor. Directions parallel to the exposed process surface 101a of the semiconductor layer 100a at a front side of the semiconductor substrate 500a are horizontal directions. A normal to the process surface 101a defines a vertical direction. The semiconductor layer 100a may be intrinsic or lightly doped. For example, the semiconductor layer 100a is a lightly doped epitaxial layer grown on an epitaxy base or a wafer obtained from a silicon ingot.

The alignment mark 400 may be formed in a region of the semiconductor substrate 500a, in which no semiconductor dies for semiconductor devices are formed, for example in a scribe line or wafer kerf separating neighboring regions for the formation of individual semiconductor dies. According to other embodiments, the alignment mark 400 may be formed in an inactive region of a semiconductor die.

The alignment mark 400 includes a groove 410 extending from the process surface 101a into the semiconductor layer 100a. The groove 410 may have a rectangular shape with four inside corners 431 and with a minimum width of at least 100 μm, e.g. at least 125 μm. According to other embodiments, the groove 410 may be a polygon with more than four inside corners 431. A bottom surface 411 of the groove 410 is parallel to the process surface 101a. The alignment mark 400 further includes one or more fins 420 protruding from a bottom surface 411 of the groove 410.

The fins 420 have a minimum distance d0 of at least 25 mm, e.g., at least 60 μm to a closest one of the inside corners 431 of the groove 410. According to an embodiment the minimum distance d0 is at least 100 mm, e.g., at least 125 μm.

A vertical extension (height) hs of the alignment mark 400 defined by the distance between the process surface 101a and the bottom surface 411 may be in a range from 100 nm to 500 nm, for example in a range from 150 nm to 400 nm. A height of the fins 420 is equal to a depth of the groove 410 and the vertical extension hs of the alignment mark 400.

Conventional alignment marks include a dense pattern of parallel trenches, wherein a distance between the trenches is in the range of the trench width. During epitaxy, the growth rate is higher in narrow corners, where an angle across the free space between intersecting surfaces is smaller than 180°, for example about 90°. Narrow corners are the corners between sidewalls of a vertical trench and a bottom surface of the trench as well as the inside corners between two intersecting vertical sidewalls of a vertical trench. During epitaxy, material predominantly deposits in the narrow corners.

Starting from narrow corners, material deposited during epitaxy chamfers to some degree the intersecting vertical sidewalls of trenches and distorts the shape of the original alignment mark. After epitaxy an alignment mark imaged into to surface of the epitaxial layer typically does not longer include sufficiently steep features, which typically provide high optical contrast.

Instead, the alignment mark 400 of FIGS. 1A to 1B includes one or more isolated fins 420 spaced in all horizontal directions from an inner sidewall 413 of the groove 410, wherein a minimum distance d0 between the outermost fins 420 and the inner corners 431 of the groove 410 is at least 25 mm, e.g., at least 60 μm, 100 μm or at least 125 μm. At least one of the distances d1 and d2 between the outermost fins 420 and orthogonal sidewalls 413 of the groove 410 may be less than or approximately 60 μm such that the groove 410 can be fitted into a scribe line and the other of the distances d1 and d2 is selected to fulfil the condition that d0 is equal to or greater than 25 μm, 60 μm, 100 μm or 125 μm. A minimum value for one of d1 and d2 is 25 μm.

A first lateral extension b1 of the groove 410 along a longitudinal axis of the fins 420 may be selected smaller than the width of typical scribe lines or kerfs, e.g., in a range from 60 μm to 100 μm. A second lateral extension b2 of the groove 420 orthogonal to the longitudinal axis of the fins 420 may be wider than typical scribe lines or kerfs, e.g., in a range from 120 μm to 400 μm.

The four outside corners 432 of each fin 420 in the horizontal cross-section are wide corners where an angle α across the free space between two intersecting fin sidewalls 423, 425 is greater than 180°, for example 270°. Even at high growth rates the epitaxial growth rate is significantly lower along the inner sidewalls and in the wide corners 432 than in the narrow inside corners 431 formed by intersecting sidewalls 413 of the groove 410. The epitaxy distorts the shape of the fin 420 to a lower degree than the shape of trenches with the same vertical extensions such that the fins 420 can be used as alignment mark even after an epitaxial process at high growth rate. At a distance d0 of the fins 420 to the closest inner corner 431 of more than 60 μm, even after growth of an epitaxial layer with a thickness of about 6 μm to 20 μm, the epitaxial growth in the inner inside corner 431 of the groove 410 has only low impact on position and horizontal cross-sectional shape of the imaged fins 420 provided that the vertical extension of the groove 410 is in range from 100 nm to 1 μm, for example in a range from 150 nm to 400 nm and further provided that a height hs of the fins 420 is equal to a depth of the groove.

If the groove 410 is too deep, i.e., the distance between the bottom surface 411 of the groove 410 and the process surface 101a is too large, the increased epitaxial growth rate on sidewalls of the groove 410 and the fins 420 may be too large such that the shape of the alignment mark 400 is distorted even at low total epitaxial growth. If the alignment mark 400 is too shallow, the groove 410 may be leveled even at comparatively low total epitaxial growth.

Sidewalls 423, 425 of the fins 420 in an initial alignment mark 400 may have a slope angle of 45 degree or less with respect to a normal onto the process surface 101a. According to an embodiment, the sidewalls 423, 425 of the fins 420 may be vertical with respect to the process surface 101a or may deviate from the vertical direction by not more than 1°.

The fins 420 may have a rectangular cross-sectional area in a horizontal plane parallel to the process surface 101a. A width w1 of the fins 420 may be in a range from 2 μm to 6 μm, e.g., about 4 μm. A length w2 of the fins 420 may be in a range from 10 μm to 40 μm, e.g., about 20 μm. A center-to-center distance d3 between neighboring fins 420 may be in a range from 15 μm to 30 μm, e.g., about 20 μm.

According to an embodiment the process surface 101a is a {001} crystal plane and all sidewalls of the fins 420 extend in a <110> crystal direction. For example, the process surface 101a as well as a top surface 421 of the fins 420 are (001) crystal planes and the fins 420 extend in the [−110] crystal direction, wherein a longitudinal axis of the fins 420 is parallel to the [−110] crystal direction and a transverse axis of the fins 420 is parallel to the [110] crystal direction.

The growth rates on the fin sidewalls 423, 425 and on the sidewall 413 of the groove 410 depend on the orientation of the sidewalls 423, 425 with respect to the crystal planes. For example, growing a silicon crystal by epitaxy tends to form {110} crystal planes indicating a lower growth rate on {110} crystal planes. Hence, if according to an embodiment referring to a process surface 101a parallel to the (001) crystal plane, the longitudinal axis of the fins 420 is parallel to the [−110] crystal direction and a transverse axis of the fins 420 is parallel to the [110] crystal direction, the horizontal cross-section of the fins 420 is better preserved than with other orientations of the fins 420 with respect to the crystal directions.

FIGS. 2A to 2J refer to a method of manufacturing a superjunction semiconductor device, wherein the method includes a regular substitution of alignment marks as described above.

A semiconductor substrate 500a may consist of or include a semiconductor layer 100a which may include an epitaxy base 105a grown on a base substrate of a crystalline semiconductor material such as silicon or cut from a silicon ingot. The semiconductor substrate 500a includes a device region 610, in which semiconductor dies for semiconductor devices are formed, and a kerf region 690 that separates neighboring device regions 610. The kerf region 690 may form a grid with the device regions 610 forming the meshes.

An initial alignment mark 401 is formed in a first kerf portion 691 of the kerf region 690, for example, by depositing a mask layer on a process surface 101a of the semiconductor layer 100a, patterning the mask layer by photolithography to form an alignment mask with openings and using the alignment mask as an etch mask for forming the initial alignment mark 401 in the process surface 101a.

Figure 2A:
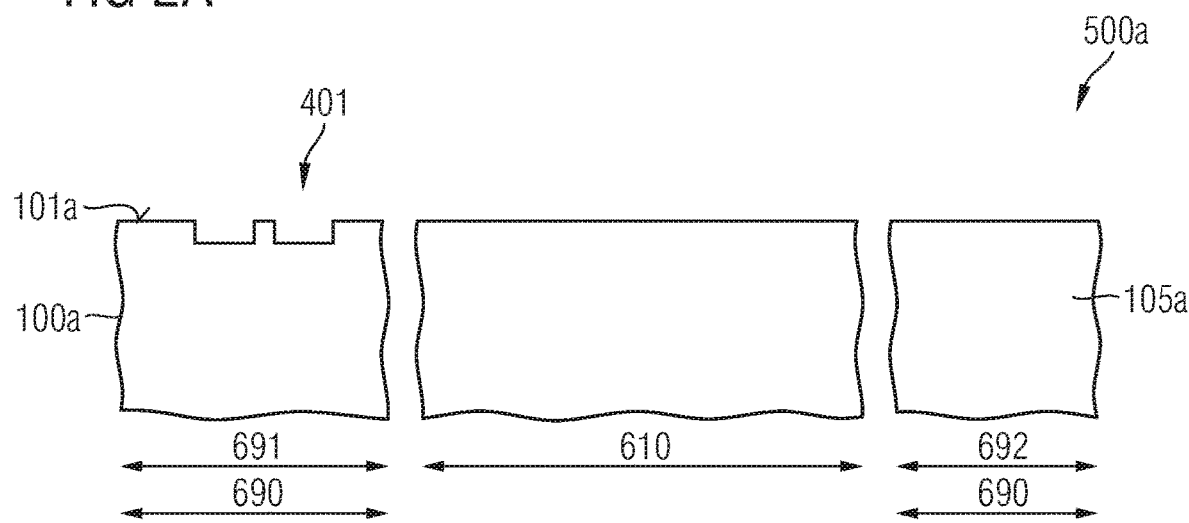
FIG. 2A is a schematic vertical cross-sectional view of a first portion of a semiconductor substrate for the formation of semiconductor devices and of second portions for the formation of alignment marks for illustrating a method of manufacturing a semiconductor device, after forming an initial alignment mark in a semiconductor layer.

FIG. 2A shows the initial alignment mark 401 in a first kerf portion 691 at the left-hand side.

A following device formation process includes a patterning process directly aligned to the initial alignment mark 401. The patterning process concerns the device regions 610 and may include deposition, etching, oxidation, and implant processes. In the illustrated embodiment, a first mask layer is deposited on the process surface 101a and patterned by photolithography that evaluates the position of the initial alignment mark 401 to adjust the exposure pattern for forming, from the first mask layer, a first implant mask 700 with first implant mask openings 701 directly aligned to the initial alignment mark 401.

For aligning an exposure mask to the initial alignment mark 401 an optical alignment device of an exposure apparatus may exclusively use position information of the fins 420 of the alignment mark 400 and may discard information about the sidewalls 413 of the groove 410. For example, the optical alignment device projects a complementary alignment mark in the exposure mask into an inspection region of the process surface 101a that includes the alignment mark 401, receives light reflected from the inspection portion of the process surface 101a and evaluates a pattern reflected from the inspection portion, wherein the pattern includes information about a misalignment between the alignment mark 401 and the projection of the complementary alignment mark.

Dopants of a first conductivity type are implanted through the first implant mask openings 701 of the first implant mask 700 into the semiconductor layer 100a.

Figure 2B:
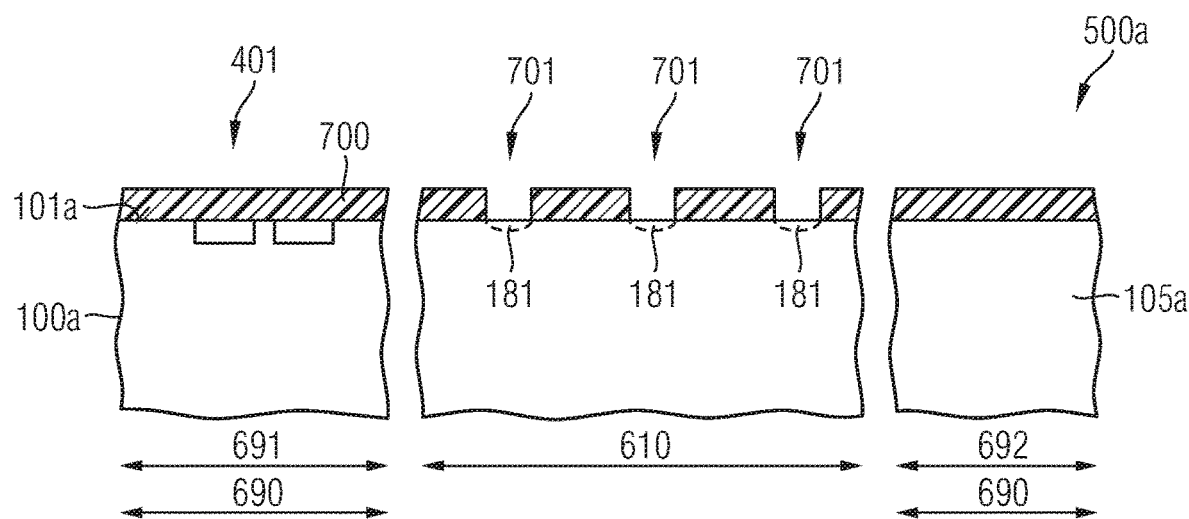
FIG. 2B shows the semiconductor substrate portions of FIG. 2A after a first device formation process directly aligned to the initial alignment mark.

FIG. 2B shows first n-type implant regions 181 formed in the semiconductor layer 100a at positions directly derived from the fins 420 of the initial alignment mark 401. The first implant mask 700 may be removed. A second mask layer may be deposited, patterned by photolithography that uses direct position information concerning the fins 420 in the initial alignment mark 401 to form, from the second mask layer, a second implant mask 705 with second implant mask openings 706. Dopants of a second conductivity type may be implanted through the second implant mask openings 706.

FIG. 2C shows first p-type implant regions 191 in the semiconductor layer 100a, wherein the position of the first p-type implant regions 191 is horizontally aligned to the first n-type implant regions 181 by directly using position information derived from the fins 420 in the initial alignment mark 401. Instead of forming the first p-type implant regions 191 after formation of the first n-type implant regions 181, the first n-type implant regions 181 may be formed after formation of the first p-type implant regions 191.

The second implant mask for the semiconductor layer 100a is removed. An epitaxy process increases thickness of the semiconductor layer 100a by forming a first epitaxial layer 110a.

FIG. 2D shows a projected alignment mark 401a, which is the image of the initial alignment mark 401 projected into the exposed surface 111a of the first epitaxial layer 110a, that forms the new process surface 101a of the semiconductor layer 100a. The first epitaxial layer 110a may have a thickness in a range from 2 μm and 10 μm, for example in a range from 2.5 μm to 5 μm. The epitaxy tilts sidewalls of the initial alignment mark 401 when the initial alignment mark 401 is imaged into the exposed surface 111a of the first epitaxial layer 110a. Due to the sufficient distance between the fins 420 and the sidewalls of the groove 410, the projected alignment mark 401a still provides sufficient optical contrast for the optical alignment device deriving position information from the projected alignment mark 401a. Outside of the projected alignment mark 401a the exposed surface 111a of the first epitaxial layer 110a is planar and flat.

FIG. 2D and the following FIGS. 2E to 2J show overgrown versions of the alignment marks for illustrative purposes only. Typically, the semiconductor material deposited during epitaxy grows in registry with the crystalline foundation such that the overgrown alignment marks are not detectable in the layer in which they are originally formed.

An optical alignment device of an exposure tool evaluates the optical response of fins 420 of the projected alignment mark 401a and may discard position information about sidewalls of the groove 410 to align an exposure mask for patterning a second n-type implant mask 710 on the first epitaxial layer 110a. Dopants are implanted through third implant mask openings 711 of the second n-type implant mask 710.

FIG. 2E shows second n-type implant regions 182 formed by the implant in the first epitaxial layer 110a in the vertical projection of the first n-type implant regions 181. Both the third implant mask openings 711 and the first implant mask openings 701 of FIG. 2B are positioned in dependence of position information derived from the same initial alignment mark 401, either directly or indirectly through the projected alignment mark 401a.

The second n-type implant mask 710 is removed. A further mask layer is deposited and patterned by photolithography using position information derived from fins in the projected alignment mark 401a to form a second p-type implant mask 715 with fourth implant mask openings 716 in the vertical projection of the first p-type implant regions 191 in the semiconductor layer 100a.

As shown in FIG. 2F, an implant through the fourth implant mask openings 716 forms second p-type implant regions 192.

The second p-type implant mask 715 for the first epitaxial layer 110a is removed and a second epitaxial layer 120a is formed on the first epitaxial layer 110a. The processes for implanting and epitaxial growth may be repeated several times, wherein for each implant a projected alignment mark derived from the initial alignment mark 401 in the epitaxy base 105a is used for positioning the mask openings in the respective implant masks.

After a total epitaxial layer thickness has reached at least 10 μm, for example about 15 μm, and before forming a further implant mask on a semiconductor layer 100a, which includes all previously formed epitaxial layers, a second alignment mask layer is deposited and patterned by photolithography aligned to the projected alignment mark in the process surface 101a to form a substitutional alignment mark 402. The substitutional alignment mark 402 may be formed in the same first kerf portion 691 as the initial alignment mark 401. According to an embodiment, the substitutional alignment mark 402 may be formed in a second kerf portion 692 outside of the first kerf portion 691.

The substitutional alignment mark 402 may have the same shape and dimensions as the initial alignment mark 401 in the epitaxy base 105a.

Figure 2G:
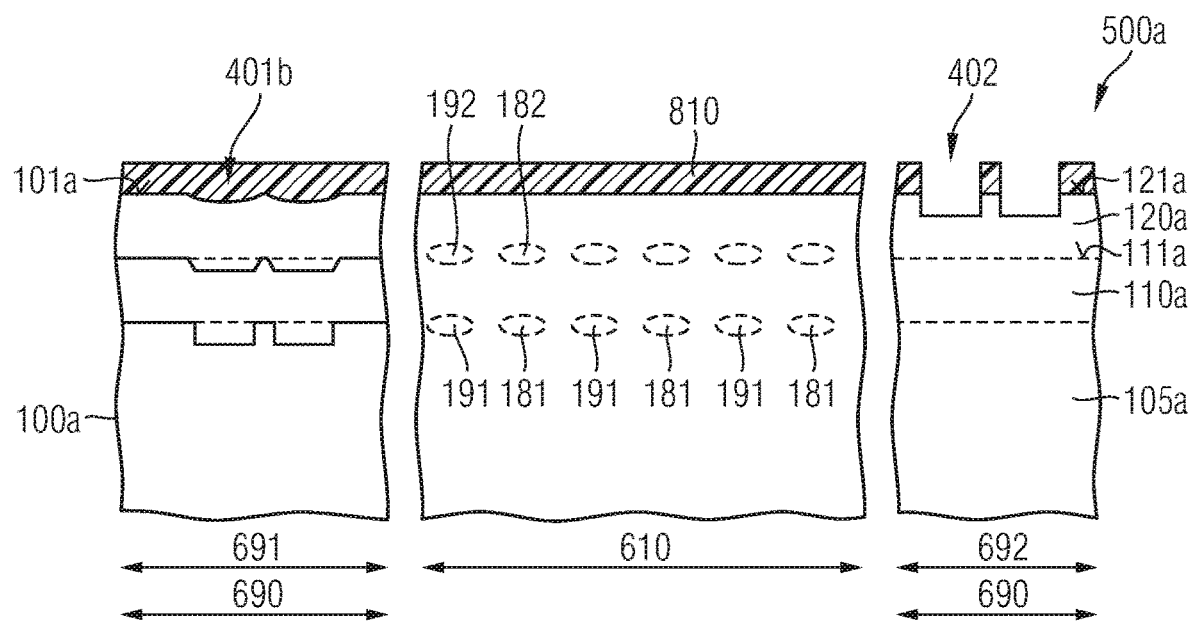
FIG. 2G is a schematic vertical cross-sectional view of the semiconductor substrate portions of FIG. 2F, after forming a substitutional alignment mark in a further epitaxial layer.

FIG. 2G shows a second alignment mask 810 with openings defining the groove 410 and the fins 420 of the substitutional alignment mark 402. The substitutional alignment mark 402 extends into the process surface 101a of the semiconductor layer 100a which includes all previously formed epitaxial layers.

The second alignment mask 810 is removed and a first further n-type implant mask 720 is formed on the process surface 101a, wherein openings 721 of the further n-type implant mask 720 are adjusted to position information directly derived from fins 420 of the substitutional alignment mark 402. Dopants of the first conductivity type are implanted through the openings 721.

Figure 2H:
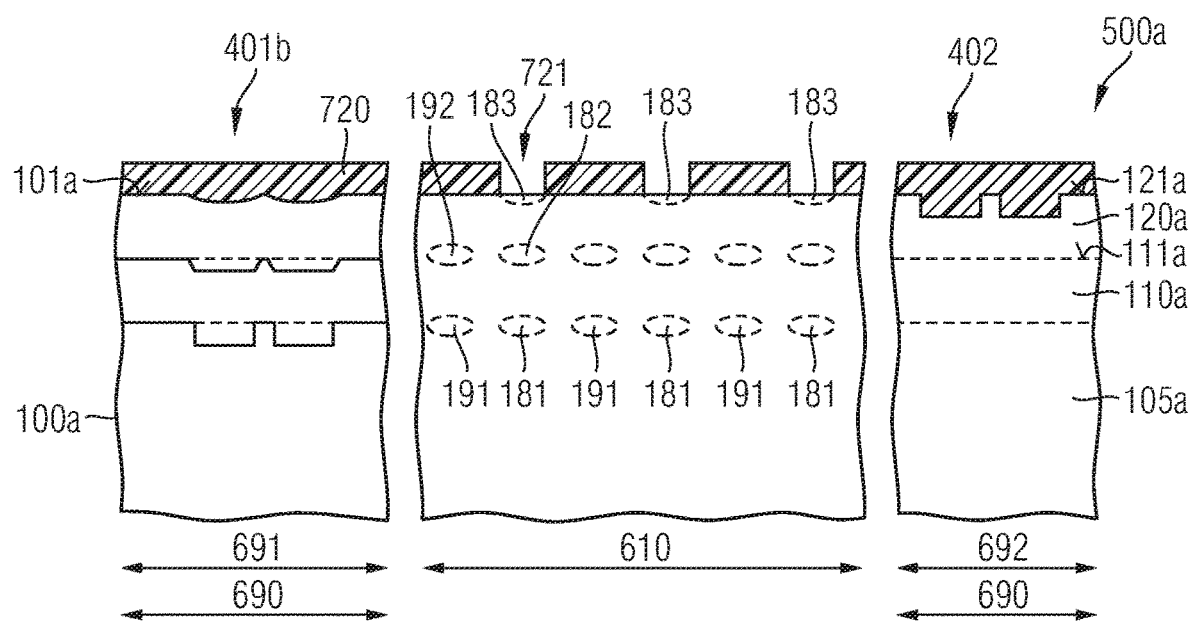
FIG. 2H is a schematic vertical cross-sectional view of the semiconductor substrate portions of FIG. 2G, after a first device formation process directly aligned to the substitutional alignment mark.

FIG. 2H shows first further n-type implant regions 183 formed by the implant in the second epitaxial layer 120a in the vertical projection of the n-type implant regions 181, 182 in the first epitaxial layer 110a and the epitaxy base 105a.

Figure 2I:
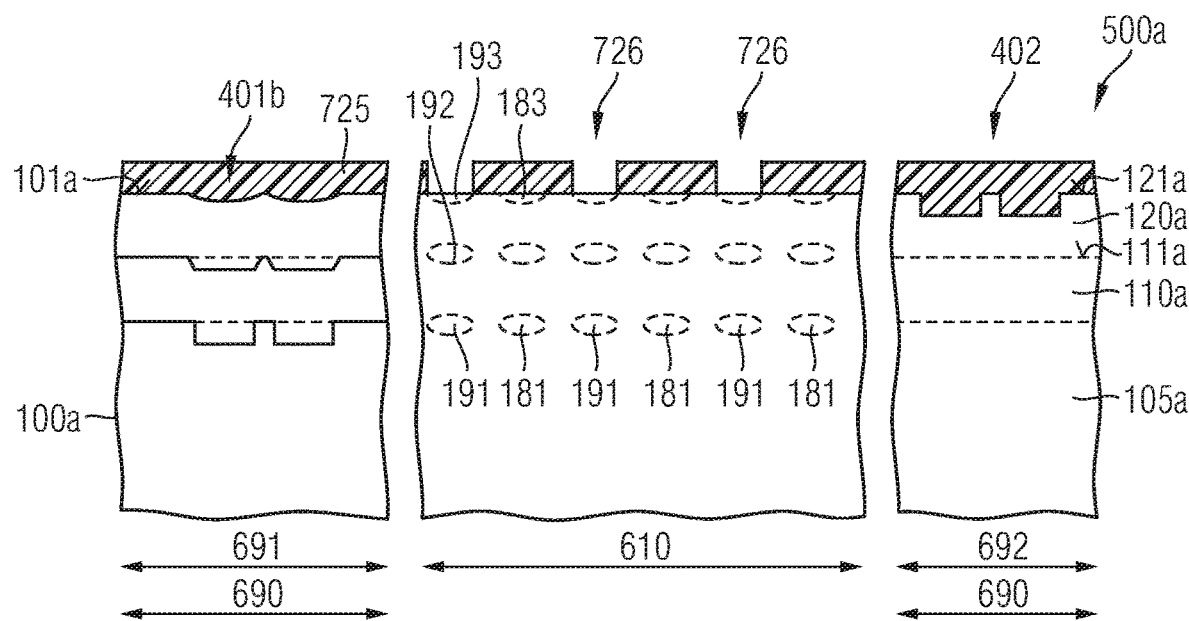
FIG. 2I is a schematic vertical cross-sectional view of the semiconductor substrate portions of FIG. 2G, after a second device formation process directly aligned to the substitutional alignment mark.

FIG. 2I shows a further p-type implant mask 725 on the second epitaxial layer 120a and first further p-type implant regions 193 in the second epitaxial layer 120a in the vertical projection of the p-type implant regions 191, 192 in the first epitaxial layer 110a and the epitaxy base 105a.

The further p-type implant mask 725 may be removed and a third epitaxial layer 130a may be grown on the process surface 101a of the semiconductor layer 100a that includes all previously formed epitaxial layers.

Figure 2J:
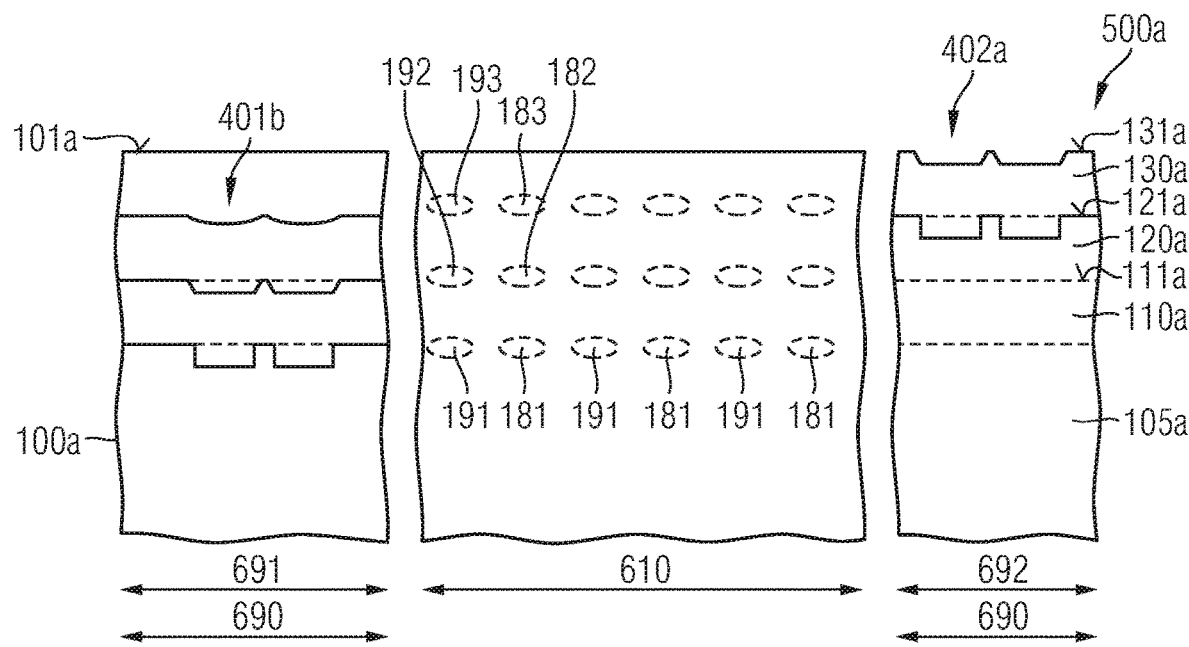
FIG. 2J is a schematic vertical cross-sectional view of the semiconductor substrate portions of FIG. 2I, after forming a further epitaxial layer.

FIG. 2J shows the third epitaxial layer 130a and vertically aligned columns of n-type implant regions 181, 182, 183 and vertically aligned columns of p-type implant regions 191, 192, 193.

The described use of projected and substitutional alignment marks 402 avoids the formation of tilted columns of implant regions, which may result in significantly deteriorated device parameters, for example as regards Rdson (on-state resistance) or Eoss (energy stored in output capacitance). On the other hand, the specific shape and dimensions of the initial and substitutional alignment marks 401, 402, . . . avoid that a resaturation of the alignment mark has to be performed in each epitaxial layer.

In the preceding description, at each stage the sequence of n-type implants and p-type implants may be changed. Instead of or in addition to implants, the device formation process between successive epitaxy processes may include patterned etch processes that may be performed in combination with preceding deposition processes, wherein materials other than crystalline semiconductor materials are deposited and patterned.

Figure 3A:
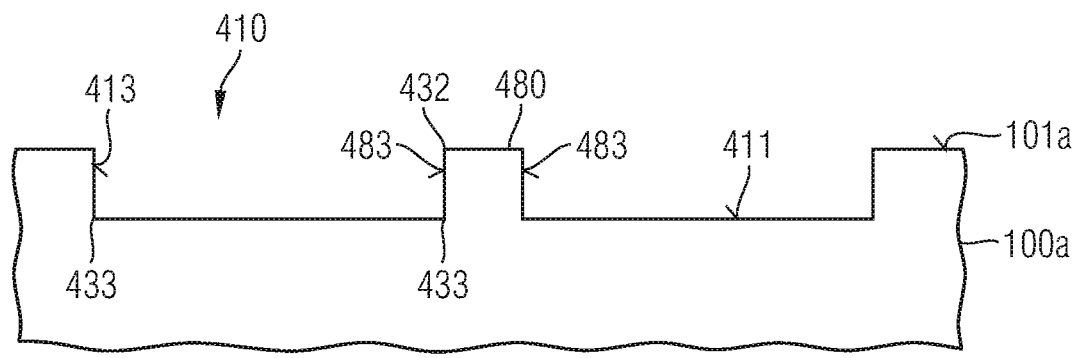
FIG. 3A is a schematic vertical cross-sectional view through a portion of an alignment mark before an epitaxial growth, for discussing effects of the embodiments.
Figure 3B:
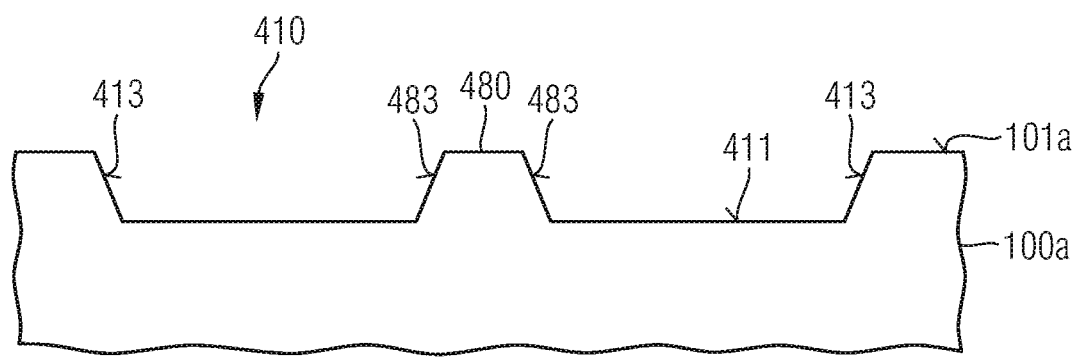
FIG. 3B is a schematic vertical cross-sectional view of the portion of the alignment mark of FIG. 3A after imaged into an exposed surface of a first epitaxial layer, for illustrating effects of the embodiments.
Figure 3C:
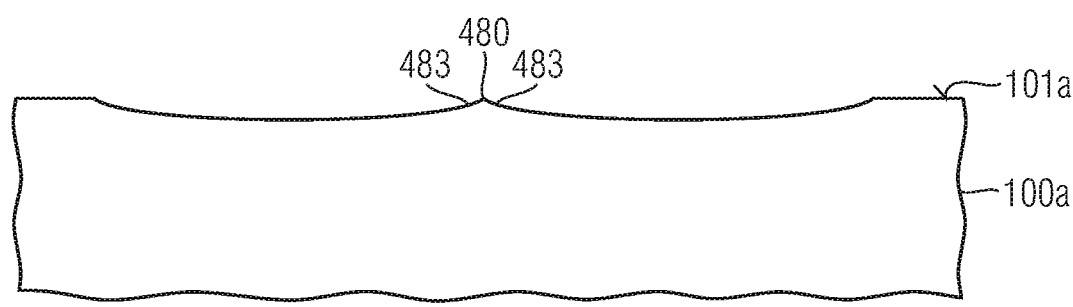
FIG. 3O is a schematic vertical cross-sectional view of the portion of the alignment mark of FIG. 3B after imaged into an exposed surface of a second epitaxial layer, for illustrating effects of the embodiments.

FIGS. 3A to 3C illustrate the modification of the shape of a feature 480 with rectangular vertical cross-section by an epitaxy process. An example of the feature 480 may be the fin 420 of the alignment mark 400 of FIGS. 1A and 1B.

In FIG. 3A the feature 480 with rectangular vertical cross-section protrudes from a bottom surface 411 of a wide groove 410 formed in a process surface 101a of a semiconductor layer 100a. Sidewalls 483 of the feature 480 and sidewalls 413 of the groove 410 may be vertical with respect to the bottom surface 411.

FIG. 3B shows a projection of the feature 480 of FIG. 3A imaged into an exposed surface of an epitaxial layer grown on the process surface 101a of the semiconductor layer 100a of FIG. 3B.

Atoms deposit at higher rate along narrow corners 433 between the vertical sidewalls 413, 483 and the bottom surface 411 of the groove 410 and along the inner corners formed between intersecting sidewalls 413 of the groove 410 in a horizontal plane. The rectangular cross-sectional shape of the original feature 480 distorts to a trapezium tapering with increasing distance to the bottom surface 411. The total growth rate along the sidewalls 483 of the feature 480 is lower than in the narrow corners between intersecting sidewalls 413 of the groove 410.

FIG. 3C shows the feature 480 after a further epitaxy. The slop angle of the feature 480 gets shallower, the top surface of the feature 480 distorts to a pointed rim and tilted sidewalls of neighboring features may interfere. With the features interfering with each other it gets more difficult to identify the feature 480 in radiation reflected from the process surface 101a.

The alignment mark 400 of FIGS. 1A and 1B reduces the effects of interfering tilted sidewalls as well as the effects of locally enhanced deposition in inner corners and in this way facilitates the repeated use of projections of the alignment mark imaged into the exposed surfaces of the epitaxial layers overgrowing the alignment mark.

Figure 4A:
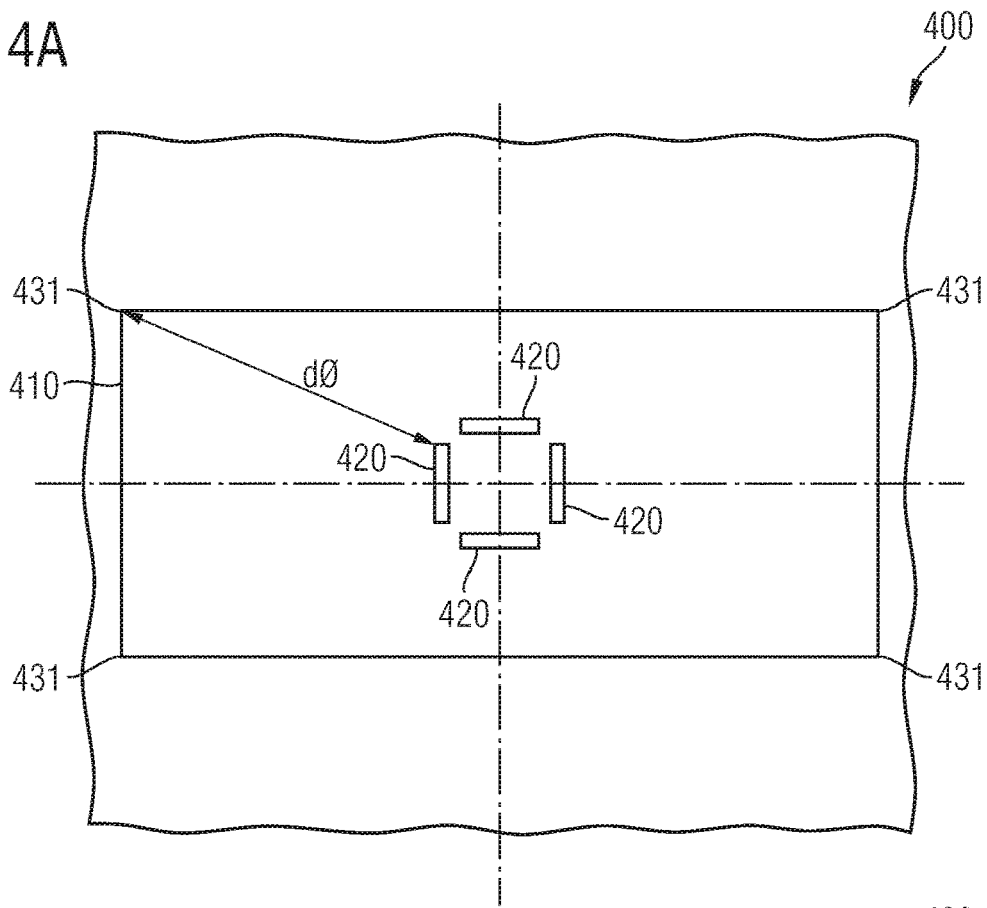
FIG. 4A is a schematic plan view of an alignment mark according to an embodiment, wherein separated fins are arranged along an outline of a rectangle.
Figure 4B:
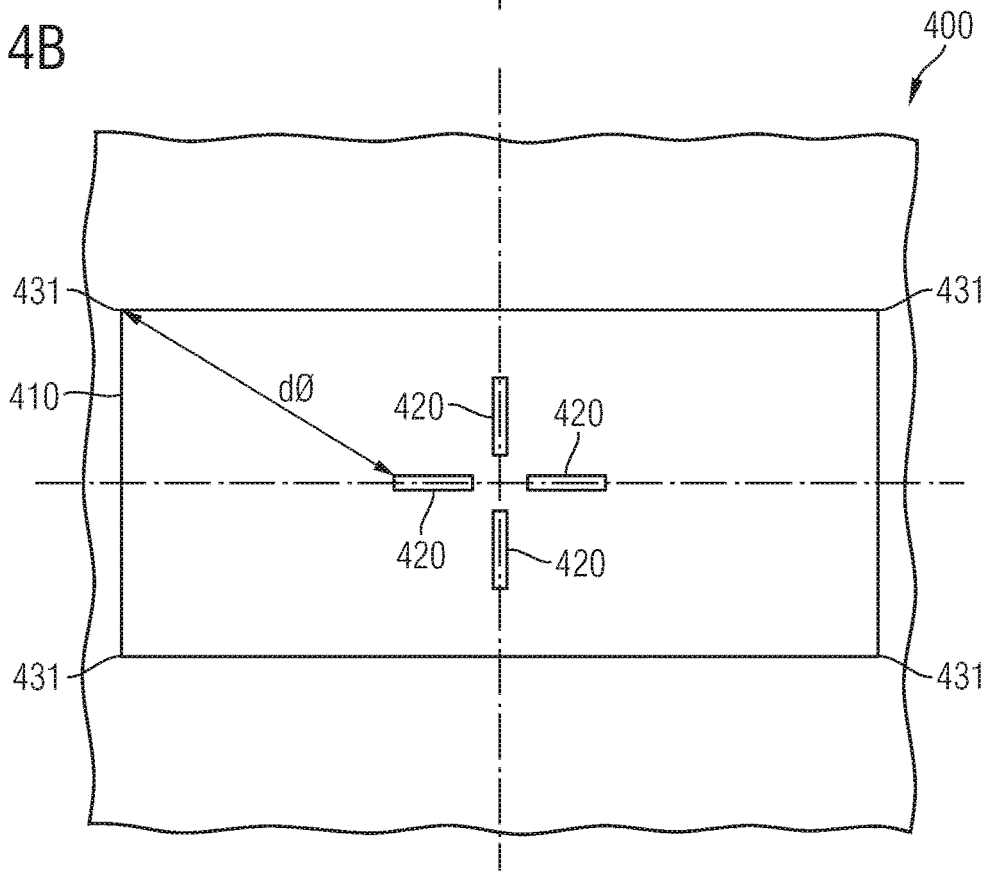
FIG. 4B is a schematic plan view of an alignment mark according to an embodiment, wherein separated fins form a cross.

FIGS. 4A and 4B refer to alternative arrangements of fins 420 in an alignment mark 400.

In FIG. 4A the alignment mark 400 includes four separated fins 420 arranged along a rectangular frame, for example a square frame in a center of a groove 410. The arrangement of the fins 420 may be symmetric with respect to at least one horizontal center axis of the alignment mark 400. In addition to alignment, the alignment mark 400 may also be used as overlay mark for determining an actual misalignment between different patterning processes.

In FIG. 4B the alignment mark 400 includes four separated fins 420 forming a cross in the center of a groove 410. The arrangement of the fins 420 may be symmetric with respect to at least one horizontal center axis of the alignment mark.

FIG. 5 shows alignment dependencies among first patterning processes I for forming a foundation that includes a superjunction structure and second patterning processes II for forming a superstructure that may include transistor cells, wherein the superstructure may be formed at least partly in an epitaxial layer grown onto the foundation after formation of the superjunction structure.

In a base layer L0 a patterning process defines an initial alignment mark 900. Implants masks for implants 905 are directly aligned to the initial alignment mark 900. An epitaxy process projects the initial alignment mark 900 into an imaged alignment mark 910 in the first epitaxial layer L1. Second implants 915 are aligned directly to the imaged alignment mark 910. In a second epitaxial layer L2 a substitutional alignment mark 922 is formed using position information about an imaged alignment mark 921 projected into the surface of the second epitaxial layer L2. Third implants 925 are directly aligned to the substitutional alignment mark 922.

The pattern may be repeated several times, wherein layer thickness and the number of layers between successively formed substitutional alignment marks may be constant or may alter.

Termination structures 980 as well as a superstructure 990 that may include transistor cells are formed in lithography levels that may use a substitutional alignment mark or an image of a substitutional alignment mark for aligning further exposure masks to the foundation I, which includes a superjunction structure emerging from the implants 905, 915, . . . .

Figure 6A:
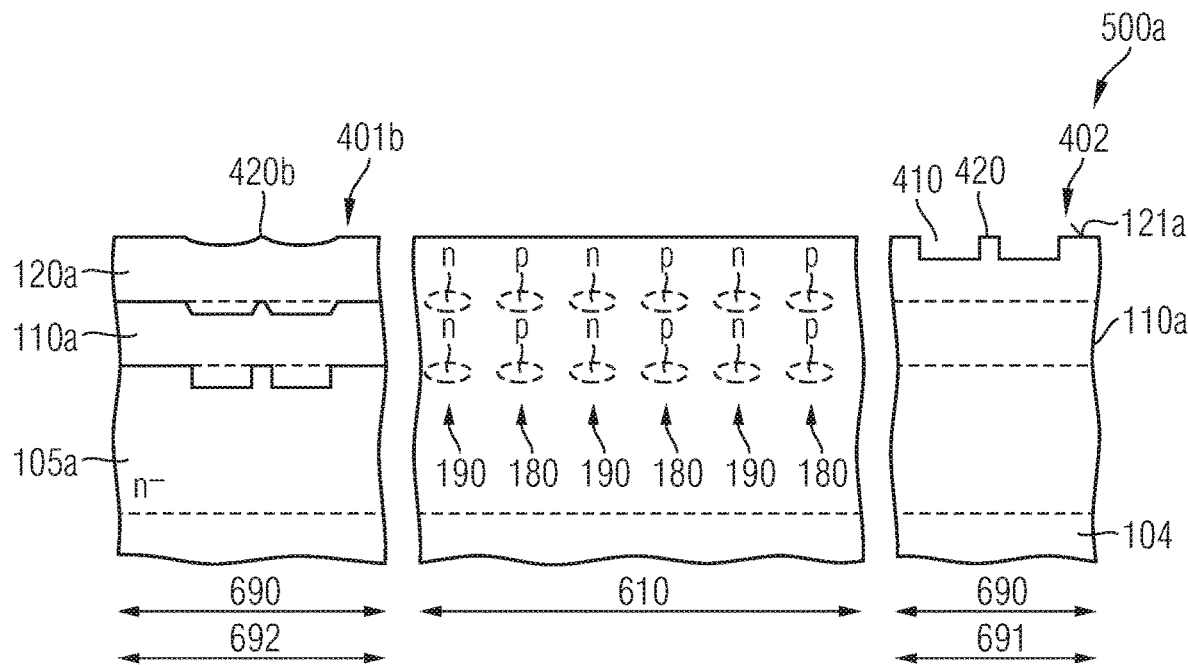
FIG. 6A is a schematic vertical cross-sectional view of portions of a semiconductor substrate according to an embodiment referring to a substitutional alignment mark in an exposed surface of an epitaxial layer.
Figure 6B:
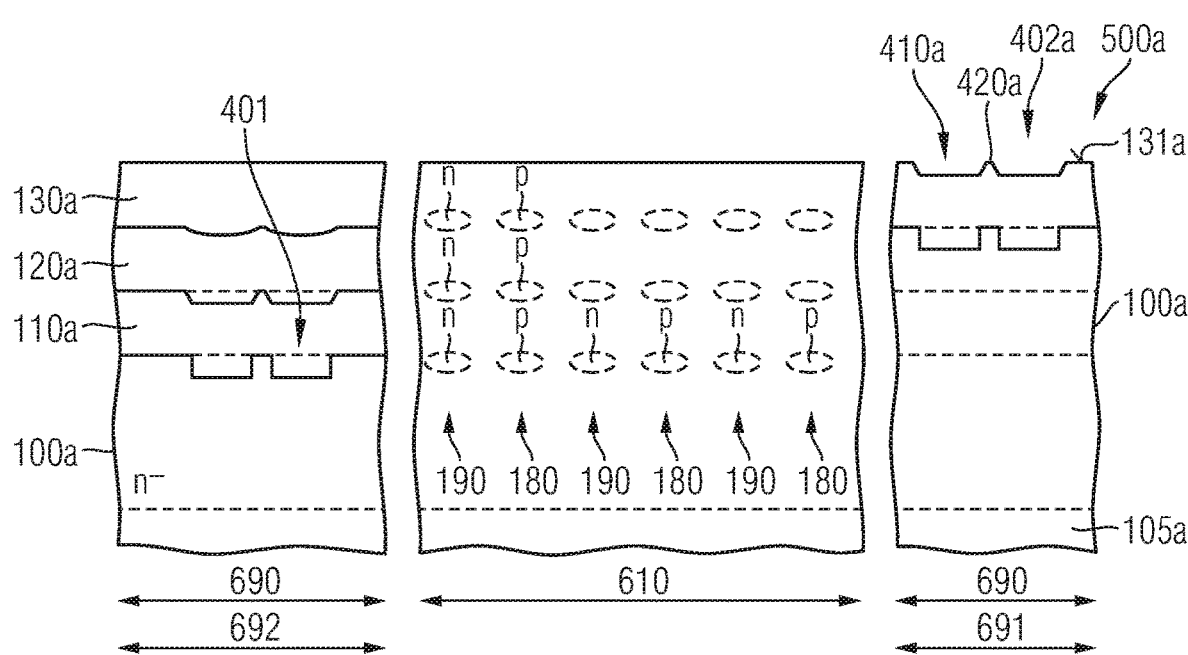
FIG. 6B is a schematic vertical cross-sectional view of portions of a semiconductor substrate with a substitutional alignment mark imaged into an exposed surface of an epitaxial layer.
Figure 6C:
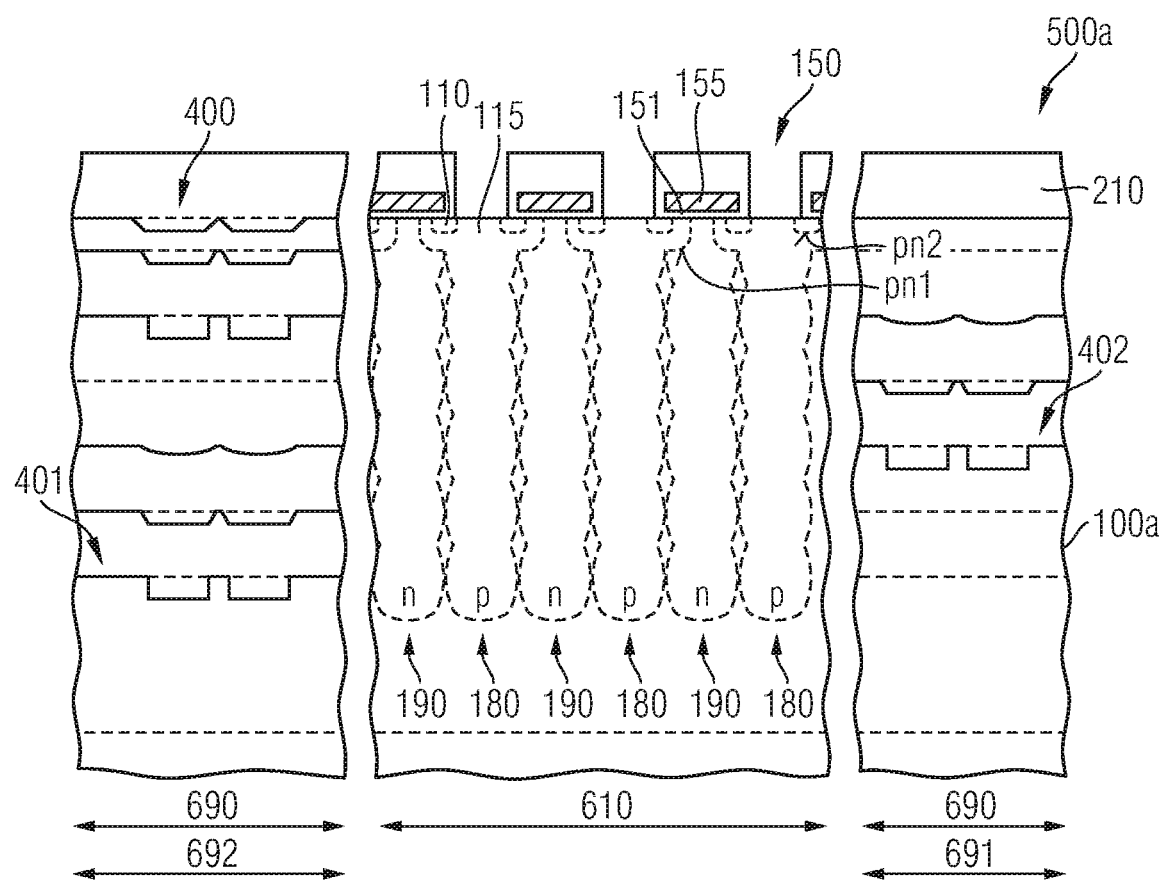
FIG. 6C is a schematic vertical cross-sectional view of portions of a semiconductor substrate according to an embodiment including a substitutional alignment mark imaged into a process surface of a semiconductor layer.

FIGS. 6A to 6C show semiconductor substrates 500a for the manufacture of superjunction semiconductor devices, which may be or may include IGFETs (insulated gate field effect transistors), IGBTs (insulated gate bipolar transistors) or power semiconductor diodes. The semiconductor substrate 500a may be a semiconductor wafer at any processing stage after formation of an initial alignment mark 401 and after formation of portions of a superjunction structure 170 in a plurality of device regions 610, wherein the initial alignment mark 401 may be formed in a first kerf portion 691 of a kerf region 690 that forms a grid enclosing single device regions 610. The initial alignment mark 401 has the structure and dimensions of the alignment mark 400 of FIGS. 1A and 1B.

The semiconductor substrate 500a may consist of or may contain a semiconductor layer 100a of a semiconductor material such as crystalline silicon. The semiconductor substrate 500a may include further conductive, dielectric or semiconducting portions. For example, the semiconductor layer 100a may be an epitaxy base 105a formed on a base substrate 104. The base substrate 104 may be obtained from a semiconductor ingot which may be thinned or completely removed during processing. The epitaxy base 105a may be an n-doped epitaxial layer formed on the base substrate 104.

In the device region 610 the semiconductor layer 100a may include portions of a superjunction structure 170 with n-type columns 180 and p-type columns 190 alternating at least one horizontal direction. For example, the n-type columns 180 and the p-type columns 190 may form parallel stripes extending into a horizontal direction perpendicular to the cross-sectional plane. In the vertical direction, each column 180 may include sub portions which are connected to each other or which may be separated from each other.

Neighboring first and second columns 180, 190 may be separated from each other or may directly adjoin to each other. The dotted lines in FIGS. 6A to 6C represent cross-sections of surfaces that connect points of equal dopant concentration. The surfaces of equal dopant concentration are undulated with convex portions resulting from implants into the exposed surface of different epitaxial layers.

FIG. 6A refers to a process stage, in which a first kerf portion 691 includes a substitutional alignment mark 402 formed in the process surface 101a of the semiconductor layer 100a, wherein the semiconductor layer 100a includes at least two epitaxial layers 110a, 120a. The substitutional alignment mark 402 has the structure and dimensions of the alignment mark 400 of FIGS. 1A and 1B. In the device regions 610 vertically oriented sections of surfaces that connect points of equal dopant concentration in the superjunction structure 170 include two convex and one concave portion.

In addition, the semiconductor layer 100a may include an imaged alignment mark 401b in a second kerf portion 692 of the kerf region 690. The imaged alignment mark 401b may include a number of shallow fins 420b with tilted sidewalls within an area defined by the horizontal dimensions of the substitutional alignment mark 402.

In FIG. 6B the semiconductor substrate 500a includes an imaged alignment mark 402a resulting from epitaxial growth on the substitutional alignment 402 of FIG. 6A. The imaged substitutional alignment mark 402a includes a shallow groove 410a and at least one shallow fin 420a extending from the shallow groove 410a and spaced from sidewalls of the shallow groove 410a in all horizontal directions. Sidewalls of the shallow fin 420a are tilted to the vertical direction by at least 15 degree. The lateral center-to-center distance of the shallow fins 420a is in a range from 15 µm to 30 µm, for example in a range from 18 µm to 22 µm.

FIG. 6C shows the semiconductor substrate 500a at a process stage after formation of gate structures 150 in the device regions 610.

The gate structures 150 may be lateral gates formed outside of the semiconductor layer 100a along the process surface 101a as illustrated. According to another embodiment the gate structures 150 may be trench gates extending from the process surface 101a into the semiconductor layer 100a. The gate structures 150 may include a conductive gate electrode 155 which may include or consist of a heavily doped polycrystalline silicon layer or a metal-containing layer. The gate structures 150 further include a gate dielectric 151 separating the gate electrode 155 from the semiconductor layer 100a. The gate dielectric 151 may include or consist of a semiconductor oxide, for example thermally grown or deposited silicon oxide, silicon nitride, for example deposited or thermally grown silicon nitride, a semiconductor oxynitride, for example silicon oxynitride, or a combination thereof. An interlayer dielectric 210 may cover the gate electrodes 155.

Source zones 110 and body zones 115 for transistor cells may be formed in a topmost epitaxial layer 190a. In the kerf region 690, a substitutional alignment mark 403 and/or an imaged alignment mark 403a may be formed in a process surface 101a of the semiconductor layer 100a.

FIG. 7 shows a semiconductor device 500, which may be or may include an IGFET, an IGBT, or a power semiconductor diode. In an active region 614 of the semiconductor device 500 functional transistor cells TC or an anode zone of a power semiconductor diode are formed through which a load current directly flows in an on-state or forward mode of the semiconductor device 500. An inactive region 615 is devoid of functional transistor cells and devoid of an anode zone of a power semiconductor diode. In an on-state or forward mode no load current flows directly through the inactive region 615. The inactive region 615 may be a portion of the semiconductor device 500 in or beyond a termination area or below gate conductors, by way of example. According to an embodiment, the inactive region 615 may be a remnant of a kerf region. The inactive region 615 includes alignment marks as discussed above.

The semiconductor device 500 may include a semiconductor portion 100 of a semiconductor material such as crystalline silicon. The semiconductor portion 100 may include a drift structure 120 with a superjunction structure 170 including first and second columns 180, 190 of complementary conductivity types and may include further conductive, dielectric or semiconducting portions.

Transistor cells TC may be formed in the semiconductor portion 100 along a first surface 101. The transistor cells TC may be based on trench gates or planar gates with gate structures 150 as described with reference to FIG. 6.

The transistor cells TC include body zones 115 that form first pn junctions pn1 with the second columns 190 of the superjunction structure 170 and second pn junctions pn2 with source zones 110. The body zones 115 may be wells extending from the first surface 101 into the semiconductor portion 100. The source zones 110 may be wells extending from the first surface 101 into the body zones 115. The source zones 110 and the body zones 115 may be electrically connected to a first load electrode 310. The gate dielectric 151 capacitively couples the gate electrode 155 to channel portions of the body zones 115.

Along a second surface 102 opposite to the first surface 101 the semiconductor portion 100 may include a heavily doped contact layer 129 electrically connected to a second load electrode 320, which may form or which may be directly connected to a drain terminal in case the semiconductor device 500 is an IGFET. A field stop layer 128 with a lower dopant concentration as the contact layer 129 may be sandwiched between the contact layer 129 and a low doped drift zone 121.

The inactive region 615 includes an alignment mark 400, which may be a substitutional alignment mark or an imaged substitutional alignment mark. An interlayer dielectric 210 may cover the alignment mark 400 and the gate structures 150. The alignment mark 400 may be or may be based on the structure and dimensions of the alignment mark 400 of FIGS. 1A and 1B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer, comprising:
    an alignment mark contained within in a kerf region of the semiconductor wafer, the alignment mark comprising:
    a groove vertically extending from a main surface of the semiconductor wafer to a bottom surface of the groove; and
    at least one fin protruding from the bottom surface of the groove,
    wherein the groove has a rectangular shape with four sidewalls and four inside corners, each of the four inside corners facing the at least one fin, and
    wherein a minimum distance between the at least one fin and a nearest one of the four inside corners is at least 25 µm.

2. The semiconductor wafer of claim 1, wherein a second lateral extension of the groove is at least 120 µm, the second lateral extension of the groove being a width of the groove in a direction that is orthogonal to a longitudinal axis of the at least one fin.

3. The semiconductor wafer of claim 2, wherein the second lateral extension of the groove is at most 400 µm.

4. The semiconductor wafer of claim 2, wherein a first lateral extension of the groove is between 60 µm and 100 µm, the first lateral extension of the groove being a width of the groove in a direction that is parallel to the longitudinal axis of the at least one fin.

5. The semiconductor wafer of claim 1, wherein the groove has a vertical extension in a range from 100 nm to 1 µm, the vertical extension being a distance between the main surface of the semiconductor wafer to the bottom surface of the groove.

6. The semiconductor wafer of claim 1, wherein sidewalls of the at least one fin extend along <110> crystal directions.

7. The semiconductor wafer of claim 1, wherein a length of the at least one fin is in a range from 5 µm to 50 µm, and wherein a width of the at least one fin is in a range from 3 µm to 10 µm.

8. The semiconductor wafer of claim 1, wherein the alignment mark comprises at least four of the fins that are arranged parallel to each other.

9. The semiconductor wafer of claim 1, wherein the alignment mark comprises at least four of the fins that are arranged along an outline of a square.

10. The semiconductor wafer of claim 1, wherein the alignment mark comprises at least four of the fins that are arranged as a cross.

11. A semiconductor device, comprising:
    an active region of a semiconductor substrate that comprises one or more active semiconductor devices;
    an inactive region of the semiconductor substrate that is adjacent the active region and is devoid of active semiconductor devices; and
    an alignment mark contained within the inactive region, the alignment mark comprising:
    a groove vertically extending from a main surface of the semiconductor substrate to a bottom surface of the groove; and
    at least one fin protruding from the bottom surface of the groove,
    wherein the groove has a rectangular shape with four sidewalls and four inside corners, each of the four inside corners facing the at least one fin, and
    wherein a minimum distance between the at least one fin and a nearest one of the four inside corners is at least 25 µm.

12. The semiconductor device of claim 11, wherein a second lateral extension of the groove is at least 120 µm, the second lateral extension of the groove being a width of the groove in a direction that is orthogonal to a longitudinal axis of the at least one fin.

13. The semiconductor device of claim 12, wherein the second lateral extension of the groove is at most 400 µm.

14. The semiconductor substrate of claim 13, wherein a first lateral extension of the groove is between 60 µm and 100 µm, the first lateral extension of the groove being a width of the groove in a direction that is parallel to the longitudinal axis of the at least one fin.

15. The semiconductor device of claim 11, wherein the groove has a vertical extension in a range from 100 nm to 1 µm, the vertical extension being a distance between the main surface of the semiconductor wafer to the bottom surface of the groove.

16. The semiconductor device of claim 11, further comprising an epitaxial layer formed on the semiconductor substrate and having an upper surface that is opposite from the upper surface of the semiconductor substrate, and a projected alignment mark in the upper surface of the semiconductor substrate.

17. The semiconductor wafer of claim 1, wherein the minimum distance between the at least one fin and the nearest one of the four inside corners is at most 125 µm.

18. The semiconductor device of claim 11, wherein the minimum distance between the at least one fin and the nearest one of the four inside corners is at most 125 µm.

* * * * *

UNITED STATES PATENT AND TRADEMARK OFFICE
CERTIFICATE OF CORRECTION

Page 1 of 1

PATENT NO. : 10,923,432 B2
APPLICATION NO. : 16/794363
DATED : February 16, 2021
INVENTOR(S) : A. Moser et al.

It is certified that error appears in the above-identified patent and that said Letters Patent is hereby corrected as shown below:

On the Title Page

Column 2 abstract (Line 5), please change "tin" to -- fin --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*